(12) United States Patent
Merlet et al.

(10) Patent No.: US 9,699,937 B2
(45) Date of Patent: Jul. 4, 2017

(54) ELECTRONIC MODULE, GUIDE RAIL OF SUCH A MODULE AND CIRCUIT BOARD INTENDED TO BE SLOTTED INTO SUCH A MODULE

(75) Inventors: Etienne Merlet, Paris (FR); Jean-Marie Courteille, Paris (FR); Jean-Eric Besold, Palaiseau (FR); Marie-Noël Besold, legal representative, Saclay (FR); Aurélie Besold, legal representative, Etampes (FR); Stéphanie Besold, legal representative, Palaiseau (FR); Antoine Besold, legal representative, Saclay (FR)

(73) Assignee: Safran Electronics & Defense, Boulogne Billancourt (FR)

( * ) Notice: Subject to any disclaimer, the term of this patent is extended or adjusted under 35 U.S.C. 154(b) by 327 days.

(21) Appl. No.: 13/876,124

(22) PCT Filed: Oct. 6, 2011

(86) PCT No.: PCT/EP2011/067460
§ 371 (c)(1),
(2), (4) Date: Nov. 4, 2013

(87) PCT Pub. No.: WO2012/045811
PCT Pub. Date: Apr. 12, 2012

(65) Prior Publication Data
US 2014/0118936 A1    May 1, 2014

(30) Foreign Application Priority Data

Oct. 8, 2010 (FR) ...................... 10 58208

(51) Int. Cl.
*H05K 7/20* (2006.01)
*G06F 1/20* (2006.01)
*H05K 1/02* (2006.01)

(52) U.S. Cl.
CPC ..... *H05K 7/20127* (2013.01); *H05K 7/20563* (2013.01); *G06F 1/20* (2013.01); *H05K 1/0201* (2013.01); *H05K 7/20145* (2013.01)

(58) Field of Classification Search
CPC .......... H05K 7/20563; H05K 7/20727; H05K 7/20736; H05K 7/20863; H05K 7/20127;
(Continued)

(56) References Cited

U.S. PATENT DOCUMENTS 3,271,626 A * 9/1966 Howrilka ...................... 361/798
3,771,023 A   11/1973 Hollingsead et al.
(Continued)

FOREIGN PATENT DOCUMENTS

EP    1 011 300 A2    6/2000
GB    2 145 290 A     3/1985

*Primary Examiner* — Zachary M Pape
(74) *Attorney, Agent, or Firm* — Muncy, Geissler, Olds & Lowe, P.C.

(57) ABSTRACT

An electronics module comprising a box including at least one pair of slideways to define a housing for receiving an electronics card, the slideways being fastened to two opposite faces of the box that are provided with ventilation means arranged to establish a flow of a total stream of air between the two faces. According to the invention, the electronics module includes at least one screen arranged in the housing between one of the slideways and the associated electronics card in order to define a passage for an individual stream of air in the housing.

18 Claims, 2 Drawing Sheets

(58) Field of Classification Search
CPC ............ H05K 7/20145; H05K 1/0201; H05K 1/0203; G06F 1/20
USPC ...... 361/679.46–679.54, 688–723, 752–759; 454/184
See application file for complete search history.

(56) References Cited

U.S. PATENT DOCUMENTS

| | | | |
|---|---|---|---|
| 4,549,602 A | | 10/1985 | Espinoza |
| 5,210,680 A | * | 5/1993 | Scheibler ...................... 361/695 |
| 5,386,346 A | * | 1/1995 | Gleadall ...................... 361/799 |
| 5,923,532 A | * | 7/1999 | Nedved ........................ 361/690 |
| 7,215,552 B2 | * | 5/2007 | Shipley et al. ............... 361/721 |
| 8,035,969 B2 | * | 10/2011 | Bellin et al. .................. 361/695 |
| 2004/0201967 A1 | | 10/2004 | Muirhead et al. |
| 2008/0158814 A1 | * | 7/2008 | Hattori ............... H05K 7/20563 361/695 |
| 2010/0118489 A1 | * | 5/2010 | Izuhara et al. ................ 361/694 |
| 2010/0216389 A1 | * | 8/2010 | Vaananen et al. ............ 454/184 |

* cited by examiner

ELECTRONIC MODULE, GUIDE RAIL OF SUCH A MODULE AND CIRCUIT BOARD INTENDED TO BE SLOTTED INTO SUCH A MODULE

The invention relates to an electronics module, and more exactly to one of those that comprises a box having at least one pair of slideways defining a housing for an electronics card.

The invention also relates to a slideway of such a module, and to an electronics card for being housed in such a module.

TECHNOLOGICAL BACKGROUND OF THE INVENTION

An electronics module, such as those used in airplanes for enabling them to operate, e.g. by providing them with calculation resources, comprise a box with housings, each of which receives an electronics card. The box is usually provided with ventilation grids arranged to create a flow of a total stream of air between two opposite faces of the box in such a manner that identical fractions of the stream of air pass through the respective housings in order to cool the electronics cards received in said housings.

It is known that the total stream of air that is to cool the electronics cards contained in the module can be defined, e.g. by adapting the size of the ventilation grids.

Unfortunately, not all electronics cards produce the same quantities of heat, such that the cooling created by uniformly sharing the total stream of air between the housings is not necessarily matched to the electronics cards.

In addition, in certain applications in the field of aviation, the electronics modules are grouped together in bays and they share the ventilation means of the bay. Standards set numerous characteristics of the electronics module, and in particular the flow rate of air and the head loss associated with ventilating the electronics module, and also the positioning of air inlets and outlets . . . imposing an air flow rate and a maximum temperature for the air at the outlet of the module in order to ensure that each module can benefit from a stream of air that is suitable for cooling its components.

An electronics module is also known that has a device for adjusting the total stream of air, which device is placed facing one of the ventilation grids.

Once more, the modified electronics module is thus characterized as a whole by a certain total cooling capacity that is not necessarily appropriate for all of the electronics cards. In addition, once the cards are in place in the electronics module, the adjustment device is difficult to access, thus making it awkward to adjust the total stream of air. Furthermore, the range over which the total stream of air can be varied is found to be limited.

OBJECT OF THE INVENTION

An object of the invention is to propose an electronics module that obviates the above-mentioned problems.

BRIEF DESCRIPTION OF THE INVENTION

In order to achieve this object, the invention proposes an electronics module comprising a box including at least one pair of slideways to define a housing for receiving an electronics card, the slideways being fastened to two opposite faces of the box that are provided with ventilation means arranged to establish flow of a total stream of air between the two faces.

According to the invention, the electronics module includes at least one screen arranged in the housing between one of the slideways and the associated electronics card in order to define a passage for an individual stream of air in the housing.

By directly defining an individual stream of air for each housing instead of the total stream of air for the entire module, it is possible to adapt the cooling to each of the electronics cards without that having an influence on the total stream of air flowing through the electronics module. The definition of the individual stream of air in the housing depends directly on the electronics card that is to be inserted in said housing, such that the cooling in the housing matches the cooling needed by the electronics card.

In a preferred embodiment, at least two housings are defined in the box, and the screen is arranged to distribute the total stream of air selectively between the two housings.

Thus, the screen makes it possible to share the total stream of air easily between the various housings, depending on the electronics cards that are to be inserted into each of the housings, which is not possible with the prior art devices that define only the total stream of air. The sharing of the total stream of air depends directly on the electronics cards that are to be inserted in the housings in compliance with the cooling needed by each of the electronics cards. If electronics cards should be switched over, it suffices also to change the screen or the position of the screen in order to share the total stream of air once more between the housings, with sharing always being performed in the best possible manner relative to the cooling required by each of the electronics cards.

Preferably, the screen is also arranged between the slideway and the electronics card so as to share the associated individual stream of air selectively between different zones of the housing.

Depending on the position of the screen, it is thus possible to redirect the individual stream of air towards particular zones of the electronics card, e.g. when the card has a zone populated by components that heat up more strongly than other components on the card.

The invention also provides a slideway for such a module, and an electronics card for housing in such a module.

BRIEF DESCRIPTION OF THE DRAWINGS

The invention can be better understood in the light of the following description of a particular, nonlimiting embodiment of the invention.

Reference is made to the accompanying drawings, in which.

DETAILED DESCRIPTION OF THE INVENTION

Figure 1:
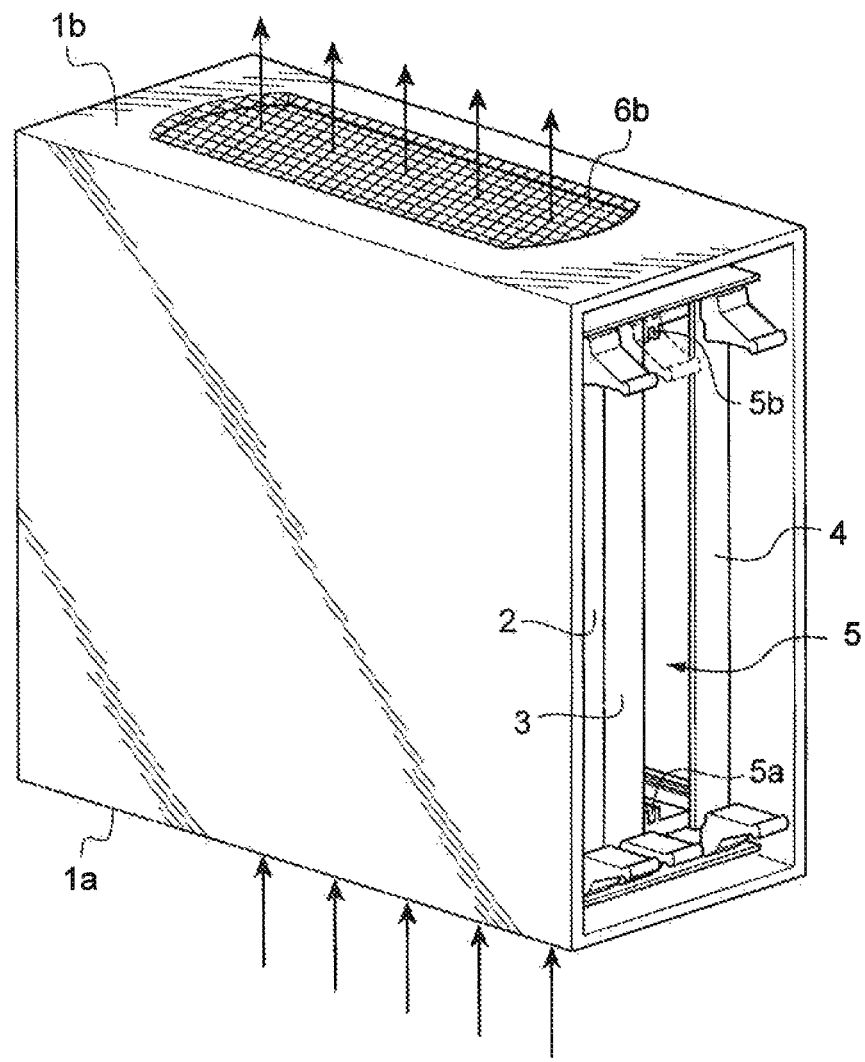
FIG. 1 is a perspective view of an electronics module of the invention.

With reference to FIG. 1, the electronics module in this example comprises a box 1 including four pairs of slideways for defining four housings. In the example shown, three electronics cards 2, 3, and 4 are received in three of the four housings, and a last housing 5 is empty. Each housing is defined by a pair of slideways arranged to receive between them an electronics card that is engaged by sliding between the slideways. The last housing 5 is thus defined by a bottom slideway 5a and by a top slideway 5b fastened respectively to the bottom face 1a of the box 1 and to the top face 1b of the box 1, the terms "top" and "bottom" being used relative to the orientation shown in FIG. 1.

Figure 2:
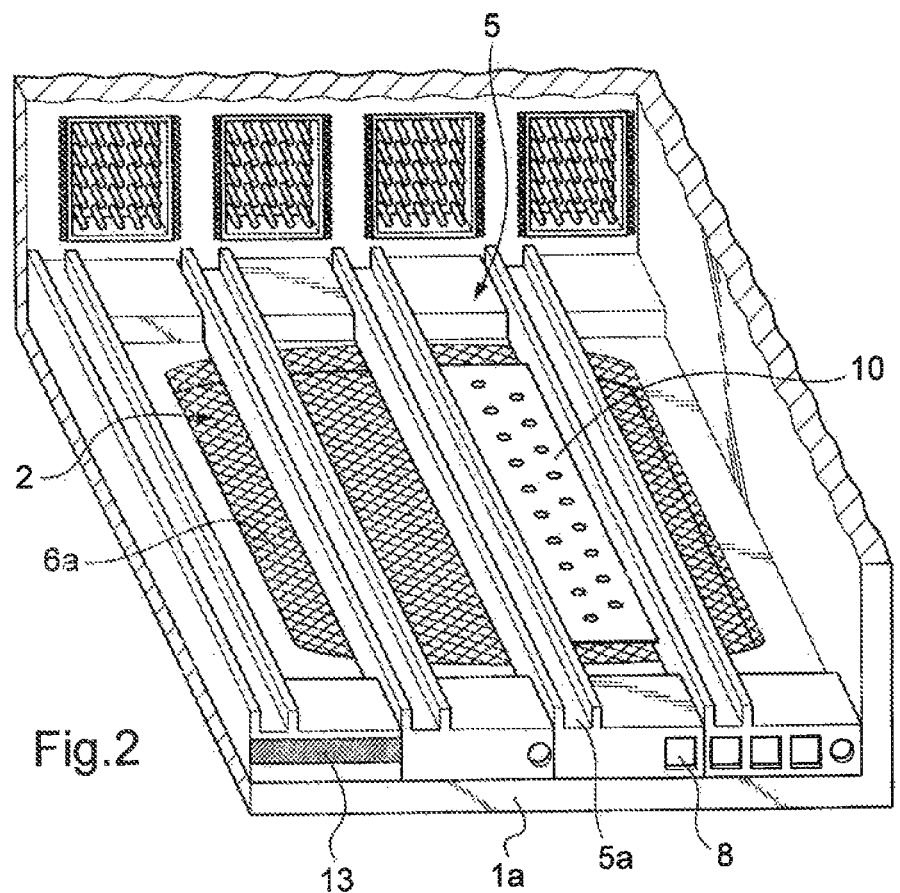
FIG. 2 is a fragmentary view of housings in the electronics module shown in FIG. 1.

The box 1 includes ventilation means arranged to create a flow of a total stream of air between its bottom face 1a and its top face 1b, as represented by the black arrows. In this example, the ventilation means comprise a bottom grid 6a (that can be seen better in FIG. 2) that is provided in the bottom face 1a of the box 1, and a top grid 6b that is provided in the top face 1b of the box 1.

Figure 3:
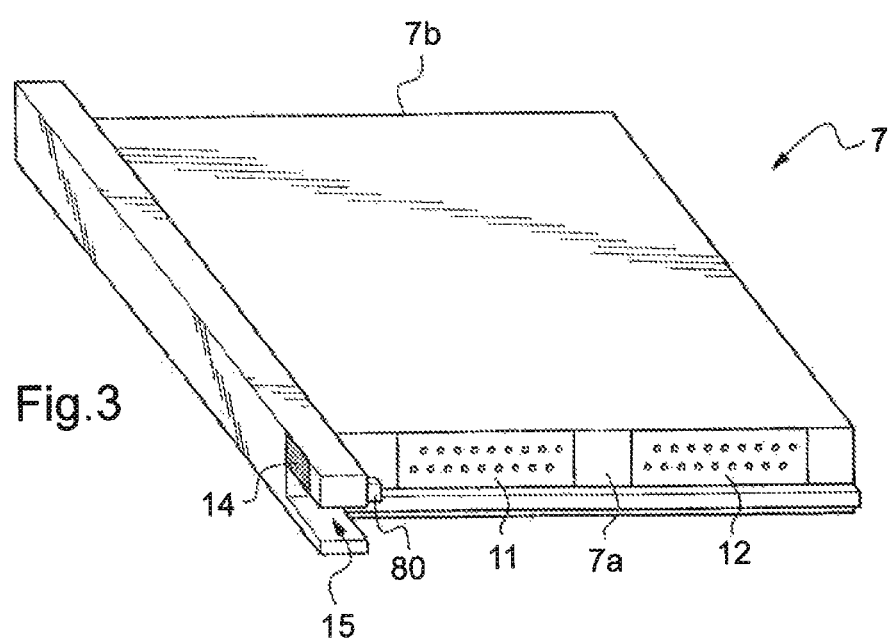
FIG. 3 is a perspective view of an electronics card for housing one of the housings shown in FIG. 2.

With reference to FIG. 3, an electronics card 7 is suitable for being inserted in the last housing 5 that is empty. The electronics card. 7 is shaped to be capable of being guided in the bottom and top slideways 5a, 5b while being received in the empty housing 5 and of being held in place in said housing by those slideways. The electronics card 7 is pushed to the end of the housing until connectors of the card 7 connect with complementary connectors of the electronics module, the complementary connectors being arranged in the box 1 at the end of the empty housing 5 (and can be seen better in FIG. 2). In conventional manner, the slideways and/or the box include locking means for opposing accidental withdrawal of the card from its housing. By way of example, these means comprise a latch that is retractable between a position in which it projects into the slideway and a position in which it is disengaged from the slideway.

According to the invention, the electronics module includes at least one screen arranged in each housing.

A screen is thus arranged in the last housing 5 between one of the top or bottom slideways 5b or 5a and the associated electronics card 7 when said card is in place in the last housing 5. The screen defines a passage in said housing 5 for an individual stream of air taken from the total stream of air, the individual stream of air being for cooling the electronics card 7.

A first screen 10 is secured to the bottom slideway 5a. The screen 10 partially obstructs the bottom grid 6a of the box 1 thereby enabling it to adjust the individual stream of air in the housing 5. By way of example, the screen 10 is a metal sheet and the bottom slideway 5a is shaped to carry said screen. In this example, the screen 10 is made integrally with the bottom slideway 5a.

The bottom slideway 5a is then characterized by the first screen 10 that in itself contributes to defining the flow section for the individual stream of air passing through the last housing 5. In a preferred embodiment, the bottom slideway 5a includes an indication of this characteristic. It is thus possible to identify quickly whether the cooling defined by the screen 10 in the last housing 5 matches the cooling required by the electronics card that is about to be inserted in said housing. In this example, the bottom slideway 5a includes keying means as the indicator. By way of example, the keying means may be constituted by a cavity 8 formed in a front face of the slideway and having dimensions that are adapted to co-operate with a peg 80 mounted in corresponding position on the card. The positioning and the dimensions of the pegs on the cards and the positioning and the dimensions of the cavities in the slideways are defined so as to correspond to a level of cooling needed for each card and to a level of cooling provided by each slideway. The keying means thus oppose putting a card properly into place if it requires a level of cooling different from the level of cooling procured by the slideway.

The electronics card 7 is also provided with a screen 11 secured to a bottom side 7a of the electronics card 7, said side being designed to face the bottom grid 6a when the electronics card 7 is in place in the housing. By way of example, the screen 11 is a metal sheet that partially obstructs the bottom grid 6a of the box 1 and thus adjusts the individual stream of air in the housing 5.

The screen 11 makes it possible to further simplify adjustment of the stream of air in the housing 5 since the electronics card 7 itself carries the second screen 11.

The electronics card. 7 is also provided with a screen 12. The screen 12 is an element mounted on the bottom side 7 of the electronics card 7. By way of example, the third screen 12 is a plastics element that can be thought of as a passive component of the electronics card 7. In this example the screen 12 comprises a plane portion that forms the screen itself and that is secured to two metal tabs in such a manner as to enable the screen 12 to be fastened to the electronics card 7 like a conventional component, i.e. by soldering.

Thus, the electronics module may include one or more types of screen, which may be different or identical, for the purpose of defining the passage of the individual streams of air through the housings. Depending on the shape and the number of screens used, it is thus possible to adapt the passage of each individual stream of air (its flow rate, its head loss, . . . ) to the power of any electronics card that might be inserted into said housing, so that the cooling defined by the screen(s) in the housing in question matches the cooling needed by the electronics card.

It should be observed that the screens may be arranged to match the stream of air in only some of the housings, and also, more generally, to share the total stream of air selectively between all of the housings of the electronics module. By placing the screens in one of the housings, the individual streams of air in the other housings are increased. It is thus possible to give precedence to cooling some of the housings. The screens may also be arranged in one of the housings so as to share the associated individual stream of air selectively between different zones of the housing. Thus, certain zones of the electronics card itself may be cooled more than others.

Naturally, the invention is not limited to the preferred embodiment shown, and the invention may be subjected to variations of implementation that appear to the person skilled in the art and without going beyond the ambit of the invention as defined by the claims.

In particular, although the screens described are shown in only one of the housings of the electronics module, it is clear that it is possible to have screens arranged in all or some of the housings of the electronics module.

Although in this example the screens are secured to a bottom side 7a of the electronics card 7 and to the bottom slideway 5a, it would naturally be possible to have the screens arranged in some other way in the electronics module. For example, the module could include screens secured to the top slideway 5b or to a top side 7b of the electronics card 7 remote from the bottom side 7a of the electronics card 7. The module could also include only screens secured to the slideway or only screens secured to the electronics card 7. In addition, the module could have any number of screens, or only a single screen. The screens could also have shapes other than those shown.

Although the screens are described above as being metal plates or plastics components, it is possible to envisage other types of screen suitable for defining the individual streams passing through the housings in question. For example, the screens could be perforated in appropriate manner. The screens could also be grids with very large openings or they could be shaped to receive obstructing plugs.

Although the first screen 10 is described as being integral with the bottom slideway 5a, the first screen 10 could merely be secured to the bottom slideway 5a. It is thus possible to imagine in that the electronics module has a screen secured to one of the slideways, e.g. by clipping the screen to the slideway once the slideway is in place in the electronics module, the electronics card not yet co-operating with said slideway. It is also possible to screw a screen to the slideway when the slideway is in place in the electronics module, the electronics card not yet co-operating with said slideway.

Although the indicator is described as being carried by the bottom slideway 5a, the indicator could be carried by the top slideway 5b.

Although the indicator characterizing the individual stream of air capable of passing through the associated housing is described as constituting keying means, the indicator could be of any other type. For example, it would be possible to have an indicator in the form of a colored strip 13, with a color code previously being defined for associating a color with a characteristic of the individual stream, such as its flow rate. It is also possible to envisage that the slideways themselves constitute indicators. For example, the slideway may be colored, with a color code previously being determined to associate a color with a characteristic of the individual stream passing through the housing, such as its flow rate.

Preferably, the module includes at least one keying means for each housing in order to avoid a mismatch between a housing and an electronics card, inserted in said housing. An additional indicator could also be arranged in one or another of the housings.

Furthermore, the electronics card 7 could also include an indicator characterizing the individual stream of air that is to pass through the housing associated with the card 7 for the purpose of cooling said card. For example, the electronics card 7 could include a colored strip 14, a color code previously being determined to associate a color with a characteristic of the stream of air that is needed for cooling the electronics card 7, such as its flow rate.

Preferably, in order to make it easier to verify that there is a match between the level of cooling needed by an electronics card 7 and the housing in which the card is to be inserted, the indicator of the electronics card 7 and the indicator of the slideway should both be colored, with the two color codes of the indicators being linked. The indicator of the slideway could be a colored strip, or the slideway itself could be colored. For example, if the electronics card 7 and the slideway are both of the same color, that means that the housing in which the slideway is fastened is appropriate for the electronics card 7 in terms of cooling said card.

Furthermore, the electronics card 7 could be shaped so that, once it is in place in one of the housings, at least a portion of the colored strip 14 of the electronics card and at least a portion of the colored indicator of the slideway are both visible from outside the housing. With reference to FIG. 3, the electronics card includes an orifice 15 so that, in this example, if the electronics card 7 is inserted in the housing 2, it always leaves a portion of the colored strip 13 visible. Thus, even if the card is in place in the housing, any potential mismatch is easily detectable, e.g. because the colors of the indicators of the slideway and of the electronics card do not correspond.

Although it is stated that an indicator or keying means characterize the individual stream of air that can or need to pass through the associated housing, an indicator or keying means could be used to characterize other parameters of the associated housing.

For example, it is known that a power electronics card requires more cooling than does a control electronics card. Keying means could thus be arranged in association with one or more housings each passing an individual stream of air suitable for cooling a control electronics card in order to prevent a power electronics card from being inserted into one or another of those housings. The keying means thus serve to characterize the functions of the various housings of the module. In a variant, if the indicator is in the form of a colored strip, one color indicates that a housing is for receiving only a power electronics card, and another color indicates that a housing is for receiving only a control electronics card.

Provision may also be made for one or more housings to have a plurality of types of keying means. For example, when a module receives a plurality of power cards having different powers and one or more control cards, each housing may have control/power keying means, and the housings that are to receive power cards may also have keying means depending on the power of the card that is to be received in said housing.

The invention claimed is:

1. An electronics module comprising a box including:
   at least one pair of slideways to define a housing, and
   at least one electronics card received in the housing,
   the slideways being fastened to two opposite faces of the box that are provided with ventilation means arranged to establish a flow of a total stream of air between the two faces,
   wherein the electronics module includes at least one screen in order to define a passage for an individual stream of air in the housing,
   the electronics module comprises keying means comprising a cavity arranged in the housing and a corresponding peg secured to the electronics card,
   wherein the positioning and the dimensions of the peg on the electronics card and the positioning and the dimensions of the cavity in the housing, are defined so as to correspond to a level of cooling needed for the card and to a level of cooling provided by the housing, the keying means thus opposing putting a card properly into the housing if the electronics cards requires a level of cooling different from the level of cooling procured by the housing.

2. The module according to claim 1, wherein the at least one screen is also arranged in such a manner as to distribute the associated individual stream of air selectively between different zones of the housing.

3. The module according to claim 1, wherein the at least one screen is an element mounted on the electronics card in place in the housing.

4. The module according to claim 3, wherein at least one face is shaped to receive the at least one screen.

5. The module according to claim 1, wherein the slideway includes an indicator characterizing the individual stream of air that can pass through the associated housing.

6. The module according to claim 5, wherein the indicator is a colored strip.

7. The module according to claim 5, wherein the slideway is itself colored in order to form the indicator.

8. The module according to claim 1, including an indicator characterizing the individual stream of air that needs to pass through the housing associated with the card in order to cool said card.

9. The module according to claim 8, wherein the indicator is a colored strip, the slideway including a colored indicator that characterizes the individual stream of air that can pass through the associated housing, the electronics card being shaped so that, once it is in place in the housing, at least a portion of the colored strip and at least a portion of the colored indicator of the slideway are visible from outside the housing.

10. An electronics module comprising a box including:
at least one pair of slideways to define a housing, and
at least one electronics card received in the housing,
the slideways being fastened to two opposite faces of the box that are provided with ventilation means arranged to establish a flow of a total stream of air between the two faces,
wherein the electronics module includes at least one screen in order to define a passage for an individual stream of air in the housing,
the electronics module comprises keying means comprising a cavity arranged in the electronics card and a corresponding peg secured to the housing,
wherein the positioning and the dimensions of the peg on the housing and the positioning and the dimensions of the cavity in the electronics card, are defined so as to correspond to a level of cooling needed for the card and to a level of cooling provided by the housing, the keying means thus opposing putting a card properly into the housing if the electronics cars cards requires a level of cooling different from the level of cooling procured by the housing.

11. The module according to claim 10, wherein the at least one screen is also arranged in such a manner as to distribute the associated individual stream of air selectively between different zones of the housing.

12. The module according to claim 10, wherein the at least one screen is an element mounted on the electronics card in place in the housing.

13. The module according to claim 12, wherein at least one face is shaped to receive the at least one screen.

14. The module according to claim 10, wherein the slideway includes an indicator characterizing the individual stream of air that can pass through the associated housing.

15. The module according to claim 14, wherein the indicator is a colored strip.

16. The module according to claim 14, wherein the slideway is itself colored in order to form the indicator.

17. The module according to claim 10, including an indicator characterizing the individual stream of air that needs to pass through the housing associated with the card in order to cool said card.

18. The module according to claim 17, wherein the indicator is a colored strip, the slideway including a colored indicator that characterizes the individual stream of air that can pass through the associated housing, the electronics card being shaped so that, once it is in place in the housing, at least a portion of the colored strip and at least a portion of the colored indicator of the slideway are visible from outside the housing.

* * * * *